(12) United States Patent
Yamasaki

(10) Patent No.: US 6,181,202 B1
(45) Date of Patent: Jan. 30, 2001

(54) DIFFERENTIAL AMPLIFIER

(75) Inventor: Koichi Yamasaki, Chiba (JP)

(73) Assignee: Seiko Instruments Inc. (JP)

( * ) Notice: Under 35 U.S.C. 154(b), the term of this patent shall be extended for 0 days.

(21) Appl. No.: 09/196,700

(22) Filed: Nov. 20, 1998

(30) Foreign Application Priority Data

Nov. 21, 1997 (JP) .................................... 9-321657

(51) Int. Cl.$^7$ ...................................... H03F 3/45

(52) U.S. Cl. .......................................... 330/257; 330/300

(58) Field of Search .................................. 330/253, 257, 330/300, 307; 327/307

(56) References Cited

U.S. PATENT DOCUMENTS

| | | | |
|---|---|---|---|
| 5,077,489 | * 12/1991 | Gola et al. | 330/257 X |
| 5,170,133 | * 12/1992 | Pernici | 330/300 X |
| 5,184,087 | * 2/1993 | Kim | 330/300 X |
| 5,304,869 | * 4/1994 | Greason | 330/257 X |

* cited by examiner

Primary Examiner—Steven J. Mottola
(74) Attorney, Agent, or Firm—Adams & Wilks

(57) ABSTRACT

The differential amplifier made in a CMOS monolisic IC form has input offset voltage worse than the case structured by the bipolar element. A bipolar element structured by a usual CMOS process is used in a differential amplifying stage having a greatest effect on input offset voltage in a CMOS differential amplifier, thereby obtaining a differential amplifier with reduced input offset voltage.

12 Claims, 7 Drawing Sheets

DIFFERENTIAL AMPLIFIER

BACKGROUND THE INVENTION

The present invention relates to a device using a differential amplifier made in CMOS monolithic IC form and to a differential amplifier made in CMOS monolithic IC form.

One example of a conventional CMOS differential amplifier is shown in FIG. 2.

A differential amplifying stage 101 has input transistors 1, 2 transistors 3, 4 forming a current mirror stage, resistors 8, 9 a constant current source 6, and an output thereof is connected to a gate of an output transistor 5 to directly drive the output transistor 5. When a gate voltage of a non-inverted input transistor 2 is higher than a gate voltage of an inverted input transistor 1, a drain voltage of the output transistor 5 as a differential amplifier output becomes high in voltage value. When the gate voltage of the non-inverted input transistor 2 is lower than a gate voltage of the inverted input transistor 1, the drain voltage of the output transistor 5 as the differential amplifier output becomes low in voltage value.

The differential amplifier formed by a CMOS element has an input offset voltage generally of approximately ±10 mV at maximum, whereas the differential amplifier formed by a bipolar element has an input offset voltage generally of approximately ±5 mV at maximum. Thus the input offset voltage of the differential amplifier formed by a CMOS element is worse in input offset voltage than that formed by a bipolar element.

In using a CMOS element, an improvement in input offset voltage of the differential amplifier can be achieved by trimming the resistances 8, 9 or other elements in FIG. 2 using a laser or the like on the chip. This however requires on-chip occupying portions thus resulting in chip size increase.

There has been a problem in that both the trimming process addition and the chip size increase constitute a factor of increased cost.

Also, the CMOS differential amplifier improved in input offset voltage by utilizing laser trimming is large in chip size and hence large in package size, and is thus not suited for mounting on small apparatuses such as portable apparatuses.

SUMMARY OF THE INVENTION

A bipolar element is structured by a usual CMOS process. The element having an effect on the input offset voltage of a CMOS differential amplifier is replaced by the bipolar element.

DETAILED DESCRIPTION OF THE INVENTION

A bipolar element structured by a typical CMOS process is employed in a differential amplifying stage having the greatest effect on the input offset voltage. Due to this, a differential amplifier is obtained that is inexpensive, mountable in small apparatuses and small in input offset voltage without addition of a trimming process and a chip size increase.

An embodiment of this invention will be explained based on the drawings.

Figure 1:
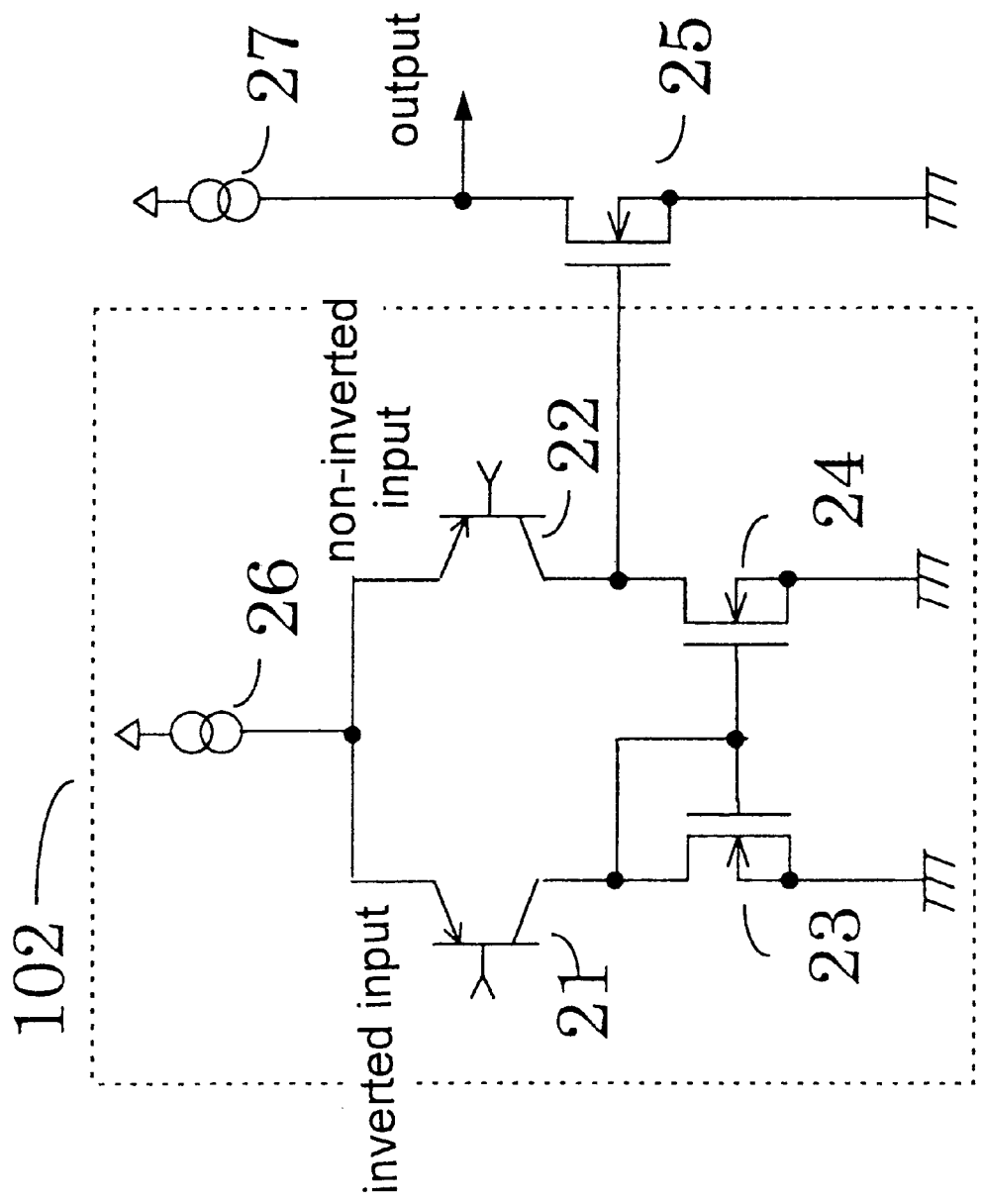
FIG. 1 is a detailed circuit diagram of a first embodiment of the present invention.
Figure 2:
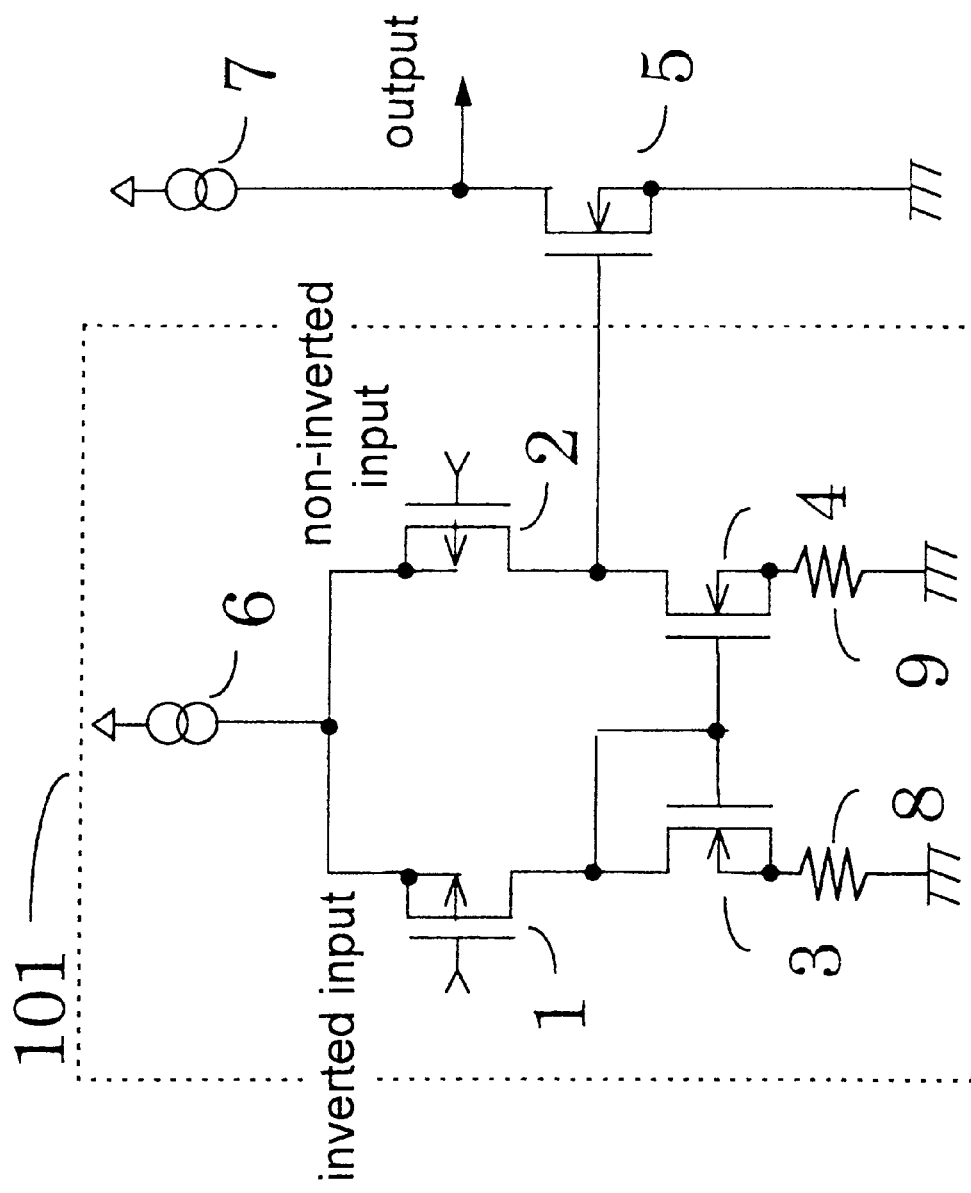
FIG. 2 is one example of a block diagram of a conventional CMOS calculating amplifier.

FIG. 1 is a detailed circuit diagram of a first embodiment of the present invention. The differential amplifier has bipolar input transistors 21, 22, a current mirror 23, 24, constant current sources 26, 27, and an output transistor 25.

Figure 3:
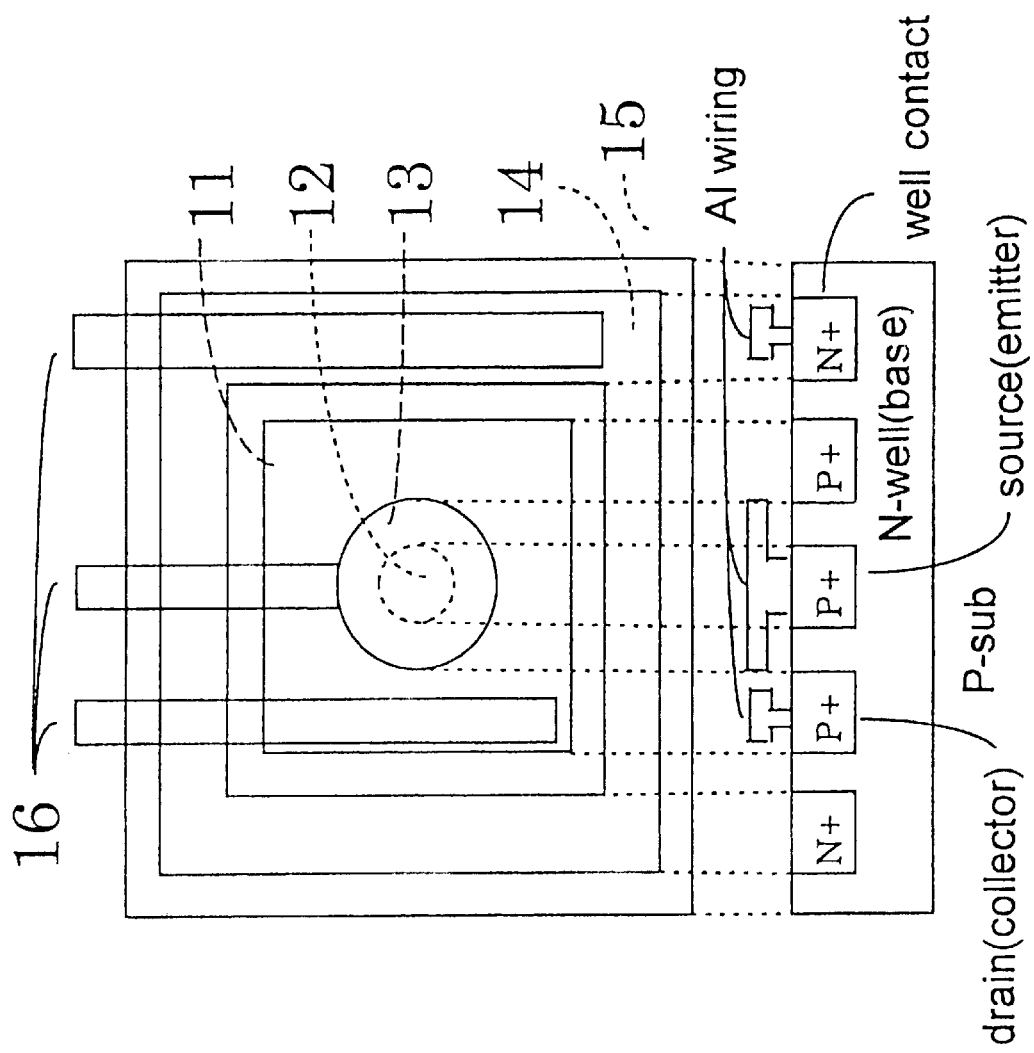
FIG. 3 is a layout view of one example of a structural view of a bipolar element used in a differential amplifying stage of the differential amplifier of the first embodiment of the present invention.

The structure of a bipolar element employed in a differential amplifying stage of a differential amplifier of the present invention is shown in FIG. 3. The transistor is a CMOS transistor having a DAA ("drain all around") structure, and is driven in a bipolar mode. Reference numerals 11, 12 denote drain and source regions of a P channel MOSFET, respectively. Reference numeral 13 denotes an N well region, and reference numeral 14 denotes a well contact. Also, reference numeral 15 denotes a P substrate region, and 16 is an aluminum interconnection.

With region 11 used as a collector region, 12 as an emitter region and 13 as a base region, a function as a lateral PNP transistor is provided by laying out, as in FIG. 3, such that the base region 13 is sandwiched in a circular form by the centered emitter region 12 and the collector region 11.

One example of a detailed circuit diagram of the present invention is shown in FIG. 1. Elements of an inverted input 21 and a non-inverted input 22 of a differential amplifying stage 102 are replaced by the PNP transistor shown in FIG. 3, instead of a P channel MOSFET. The differential amplifier has an input offset greatly affected by the input elements 21, 22. By replacing these elements by the bipolar transistor, the input offset is improved.

Figure 4:
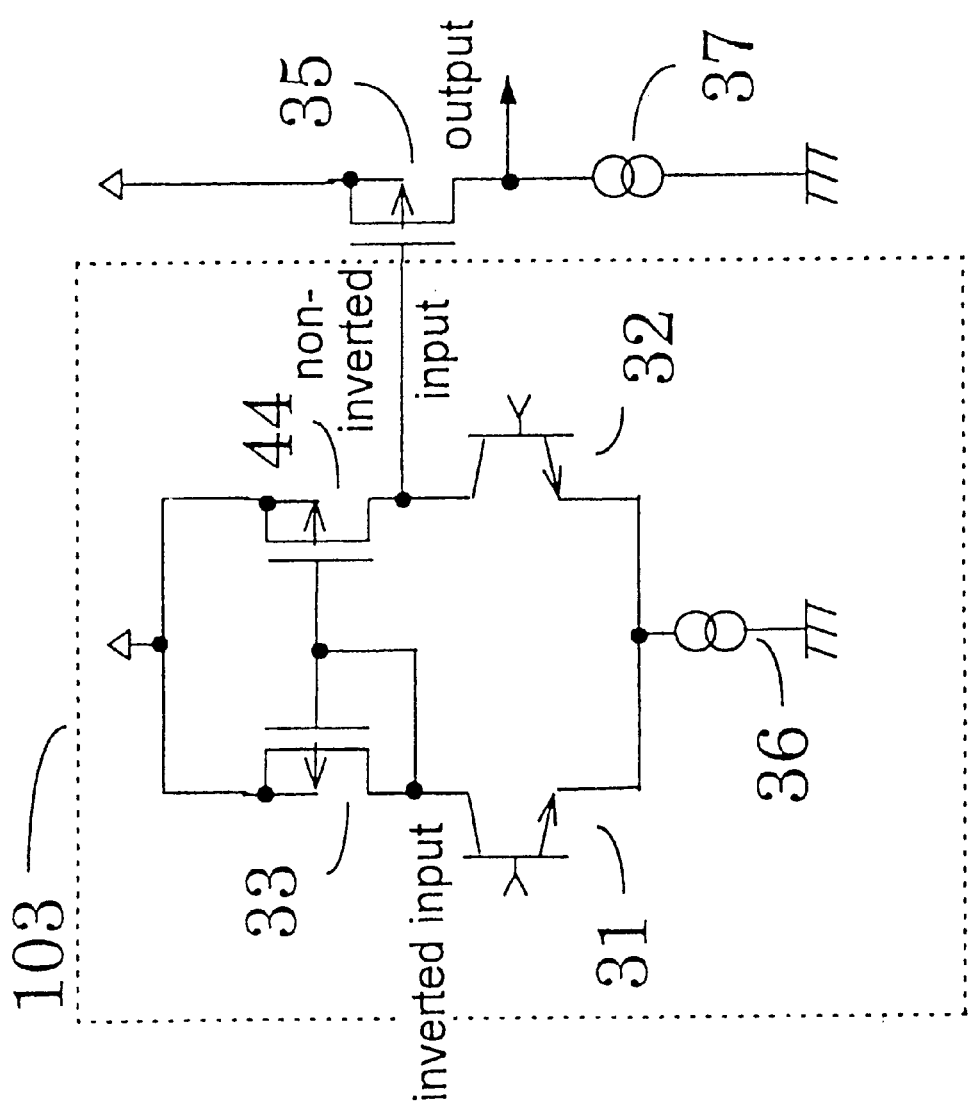
FIG. 4 is as detailed circuit diagram of a second embodiment of the present invention.
Figure 5:
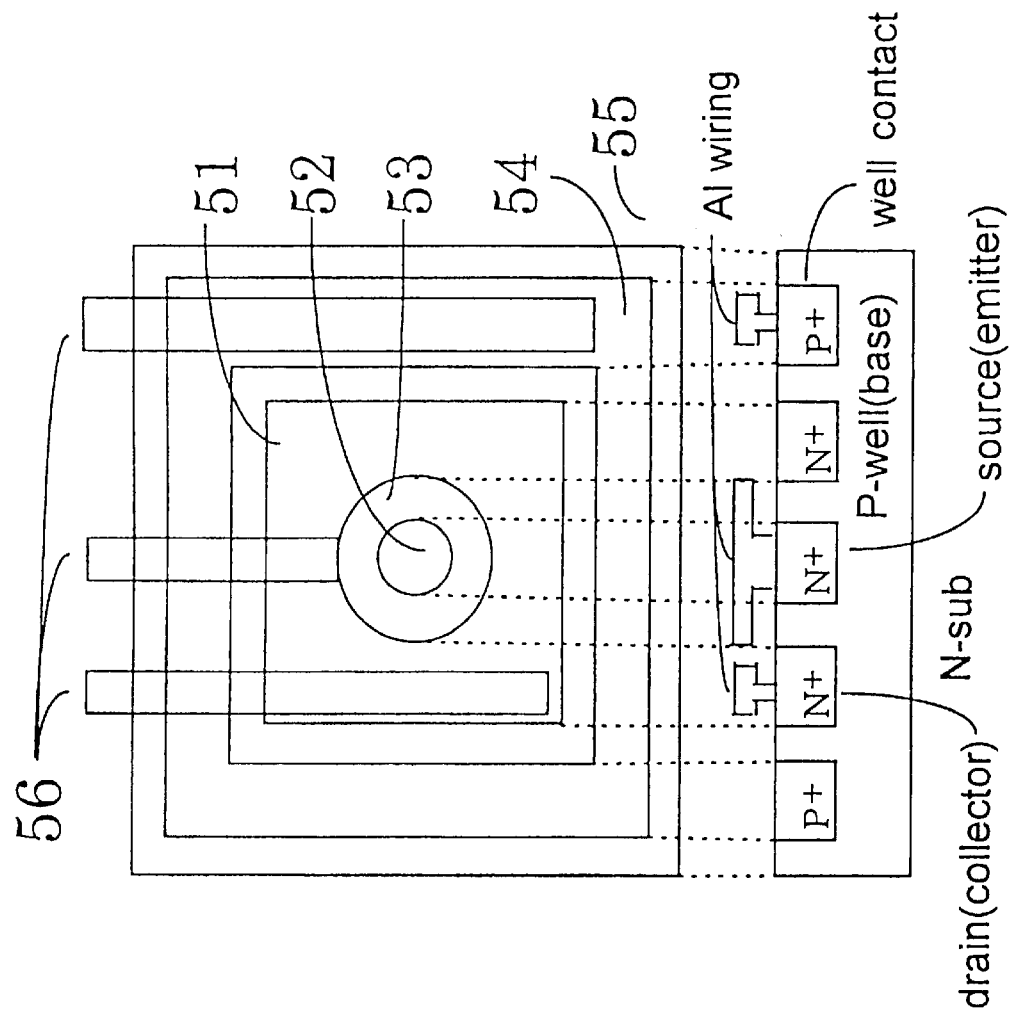
FIG. 5 is a layout view of one example of a structural view of a bipolar element used in a differential amplifying stage of the second differential amplifier of the present invention.

In FIG. 4, a circuit having bipolar input transistors 31, 32, a current mirror stage 33, 44, constant current sources 36, 37 and an output transistor 35 is shown. The inverted input 31 and a non-inverted input 32 of the differential amplifying stage 103 are replaced by an NPN transistor, instead of an N channel MOSFET. In this case also, the improvement in input offset is clear, similarly to the case that when the P channel MOSFET is replaced by the PNP transistor. The NPN transistor in this case has a structure as in FIG. 5 and can be formed by a CMOS process similarly to the PNP transistor.

Reference numerals 51, 52 denote drain and source regions, respectively, of an N channel MOSFET. Reference numeral 53 denotes a P well region, and reference numeral 54 denotes a well contact. Reference numeral 55 denotes a substrate region, and reference numeral 56 denotes an aluminum interconnection. As in FIG. 3, the drain and source regions 51, 52 of the N channel MOSFET are used as the collector and emitter regions of the NPN transistor, and the P well region 53 is used as the base region thereof.

Figure 6:
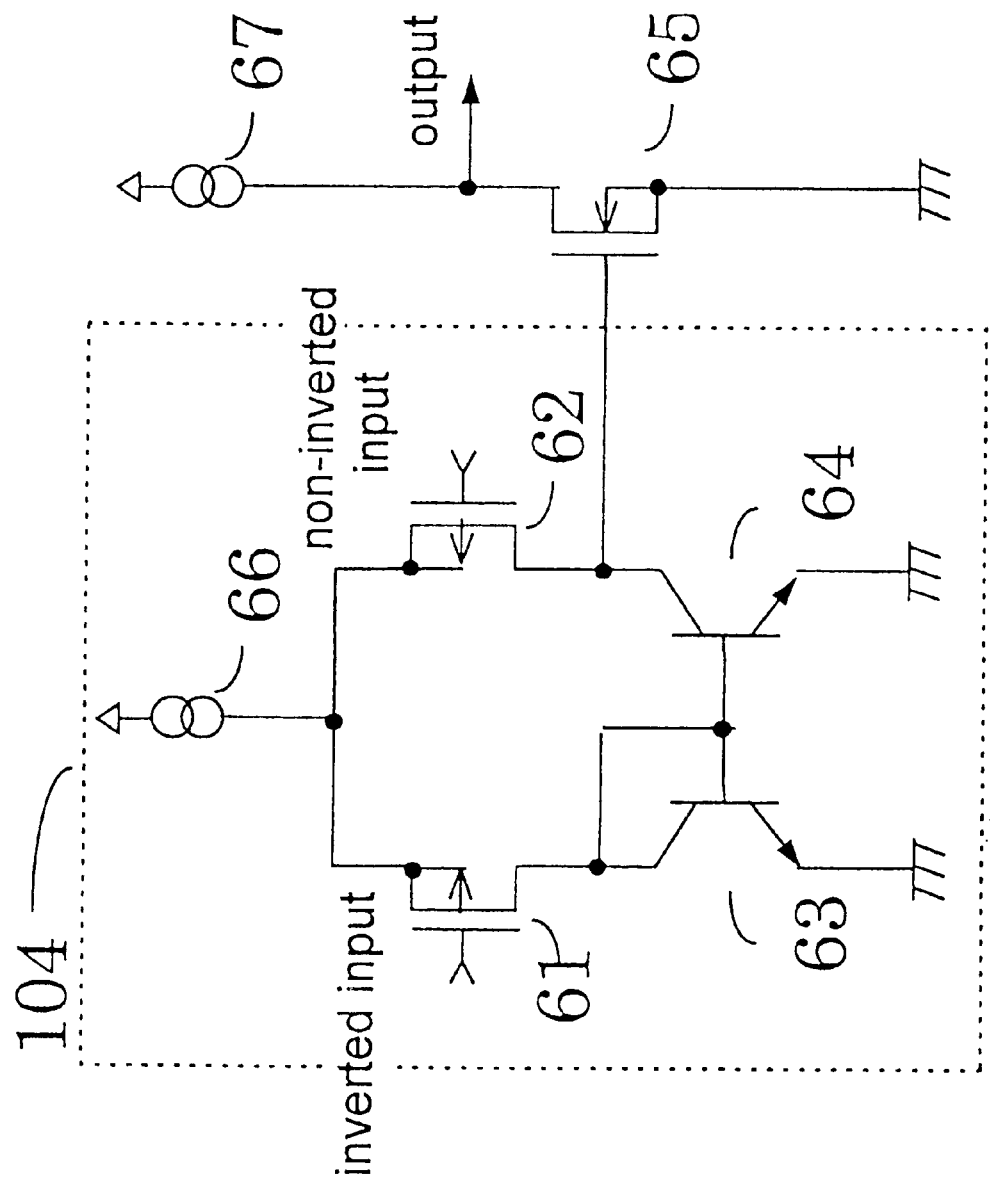
FIG. 6 is a detailed circuit diagram of a third embodiment of the present invention.

FIG. 6 is an example in which elements 63, 64 in a current mirror circuit section of a differential amplifying stage 104 are changed from an N channel MOSFET to an NPN transistor. This case also improves input offset. This circuit has CMOS input transistors 61, 62, constant current sources 66, 67 and an output transistor 65 which are the same as in the conventional device.

Figure 7:
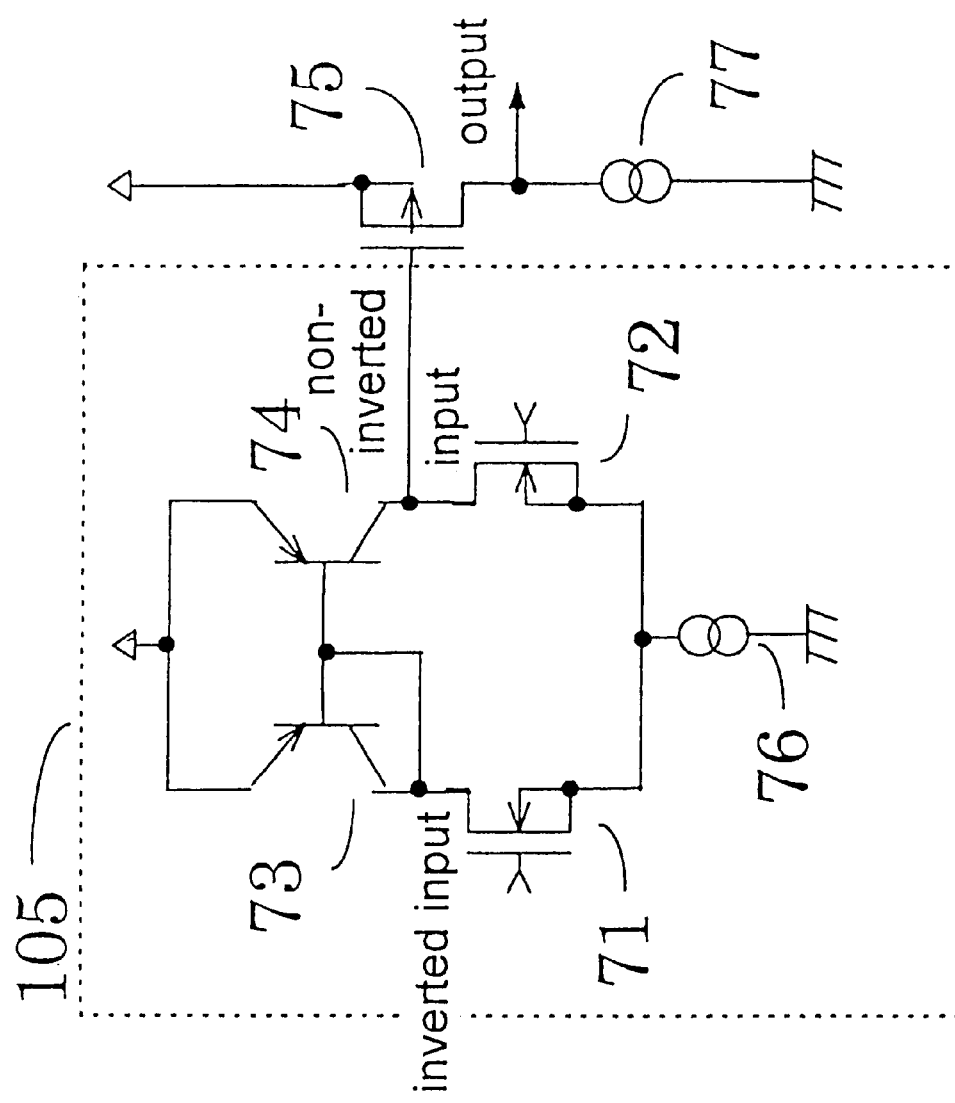
FIG. 7 is a detailed circuit diagram of a fourth embodiment of the present invention.

FIG. 7 is an example in which elements 73, 74 in a current mirror circuit section of a differential amplifying stage 105 are changed from a P channel MOSFET to a PNP transistor. It is clear that this case also improves input offset. Input transistors 71, 72, constant current sources 76, 77, and output transistor 75 have an opposite conductivity from those in FIG. 6.

This invention structures a bipolar transistor by a CMOS process, and, if utilized to improve differential amplifier offset, achieves the object. There is no necessity of modifying a circuit.

The bipolar element is structured by a typical process, and use of the bipolar element for an element having an effect on input offset voltage provides a differential amplifier that is inexpensive, mountable on a small device and small in input offset voltage without addition of a trimming process and without a chip size increase.

What is claimed is:

1. A CMOS differential amplifier for amplifying a difference in level between input voltages comprising: an input stare having at least a pair of input terminals for receiving input voltages; and a current mirror stage; wherein at least one transistor in the input stage is a bipolar transistor formed by a CMOS process, so that the input offset voltage of the differential amplifier circuit is smaller than if said element were a CMOS element formed by a CMOS process; and wherein the bipolar transistor comprises a CMOS transistor having source and drain regions formed in a substrate and driven in a bipolar mode, wherein the source region serves as the emitter of the bipolar transistor, the drain region serves as the collector of the bipolar transistor and a region of the substrate proximate the source and drain regions serves as the base of the bipolar transistor.

2. A differential amplifier according to claim 1; wherein the CMOS transistor has a DAA structure in which the source is surrounded entirely by the drain region.

3. A differential amplifier according to claim 1; wherein the bipolar transistor is a PNP transistor.

4. A differential amplifier according to claim 1; wherein the bipolar transistor is an NPN transistor.

5. A differential amplifier comprising: an input stage having a first input terminal for receiving a first input voltage; a first input transistor connected to the first input terminals; a second input terminal for receiving a second input voltage; a second input transistor connected to the second terminal; a current mirror circuit comprising third and fourth transistors connected to the first and second transistors; and a constant current source for supplying a constant current to the first and second transistors; wherein the third and fourth transistors are bipolar transistors formed by a CMOS process.

6. A differential amplifier according to claim 5; wherein the first and second transistors are bipolar transistors formed by a CMOS process.

7. A differential amplifier according to claim 6; wherein the bipolar transistors are PNP transistors.

8. A differential amplifier according to claim 6; wherein the bipolar transistors are NPN transistors.

9. A differential amplifier according to claim 5; wherein the bipolar transistors are PNP transistors.

10. A differential amplifier according to claim 5; wherein the bipolar transistors are NPN transistors.

11. A differential amplifier comprising:

an input stage for receiving at least two input voltages; and a current mirror stage connected to the input stage; wherein at least one transistor in the current mirror stage is a bipolar transistor formed by a CMOS process and comprises a CMOS transistor driven in a bipolar mode, and at least another transistor in one of the input stage and the current mirror stage comprises a CMOS transistor that is not driven in a bipolar mode.

12. A differential amplifier according to claim 11; wherein all of the transistors in at least one of the input stage and the current mirror stage are bipolar transistors formed by a CMOS process.

* * * * *